United States Patent [19]
Winnerl

[11] Patent Number: 6,154,084
[45] Date of Patent: Nov. 28, 2000

[54] METHOD FOR SWITCHING VOLTAGES HIGHER THAN A SUPPLY VOLTAGE ON A SEMICONDUCTOR CHIP WITH A CIRCUIT CONFIGURATION

[75] Inventor: Josef Winnerl, München, Germany

[73] Assignee: Infineon Technologies AG, Munich, Germany

[21] Appl. No.: 08/890,247

[22] Filed: Jul. 9, 1997

[30] Foreign Application Priority Data

Jan. 9, 1995 [DE] Germany .................. 195 00 393

[51] Int. Cl.⁷ .................................. H03K 19/0185
[52] U.S. Cl. .................. 327/333; 326/62; 326/68
[58] Field of Search .................. 326/62, 68, 80, 326/81; 327/333

[56] References Cited

U.S. PATENT DOCUMENTS

| | | | |
|---|---|---|---|
| 4,649,521 | 3/1987 | Tsuchida et al. | 365/185 |
| 4,656,373 | 4/1987 | Plus | 365/226 |
| 5,266,848 | 11/1993 | Nakagome et al. | 326/62 |
| 5,723,980 | 3/1998 | Nakashiro et al. | 326/81 |

FOREIGN PATENT DOCUMENTS

| | | |
|---|---|---|
| 0082208A1 | 6/1983 | European Pat. Off. . |
| 0528688A1 | 2/1993 | European Pat. Off. . |

OTHER PUBLICATIONS

Japanese Patent Abstract No. 6–37624 (Koyada), dated Feb. 10, 1994.

"Proceedings" ISSCC 1991, p. 260.

Primary Examiner—Tuan T. Lam
Attorney, Agent, or Firm—Herbert L. Lerner; Laurence A. Greenberg; Werner H. Stemer

[57] ABSTRACT

A method for switching high positive or negative voltages to an output terminal of a circuit configuration includes connecting a series circuit of a first p-channel transistor and a first n-channel transistor between terminals for the two voltages. Gates of the two transistors are connected through load paths of transistors of the other respective conduction type to first and third input terminals. Gates of the transistors of the other conduction type are respectively connected to second and fourth input terminals. The first p-channel transistor and the first n-channel transistor can each be locked through load paths of transistors of the same conduction type which are connected between their gate terminals and the respective terminals for the high positive and high negative potential, and the gates of the transistors of the same conduction type are connected to the output terminal. Either the high positive potential or the high negative potential can be switched through to the output terminal depending on the potential at the input terminals.

8 Claims, 4 Drawing Sheets

METHOD FOR SWITCHING VOLTAGES HIGHER THAN A SUPPLY VOLTAGE ON A SEMICONDUCTOR CHIP WITH A CIRCUIT CONFIGURATION

CROSS-REFERENCE TO RELATED APPLICATION

This application is a continuation of International Application Ser. No. PCT/DE95/01804, filed Dec. 15, 1995.

BACKGROUND OF THE INVENTION

FIELD OF THE INVENTION

The invention relates to a method for switching voltages higher than a supply voltage, on a semiconductor chip through the use of a circuit configuration, including a first series circuit having a first p-channel transistor and a first n-channel transistor and being connected between a terminal for a first high potential and a terminal for a first low potential; a second series circuit having a second p-channel transistor and a second n-channel transistor and being connected between the terminal for the first high potential and a first input terminal; a junction point of the two transistors of the first series circuit being connected to a gate terminal of the second p-channel transistor and forming a terminal for an output signal; a junction point of the transistors of the second series circuit being connected to a gate terminal of the first p-channel transistor; a gate terminal of the second n-channel transistor forming a second input terminal; a third series circuit having a third p-channel transistor and a third n-channel transistor and being connected between a third input terminal and the terminal for the first low potential; the junction point of the two transistors of the first series circuit being connected to a gate terminal of the third n-channel transistor; a junction point of the transistors of the third series circuit being connected to the gate terminal of the first n-channel transistor; and a gate terminal of the third p-channel transistor forming a fourth input terminal.

Such a circuit configuration is disclosed in a paper in Proceedings ISSCC 1991, page 260. In that case, the gate terminal of the first n-channel transistor is connected to the gate terminal of the first p-channel transistor. In addition, the first low potential is equal to the earth or ground potential.

In the case of circuits integrated on semiconductor chips, it is often necessary to supply further voltages in addition to the customary operating voltages of, for example, +5V and 0V for TTL and CMOS, which further voltages may be significantly higher or even negative, or to generate the further voltages on the chip from the operating voltages and, if appropriate, to switch them on and off. If such semiconductor chips contain non-volatile memories such as, for example, EPROMs, EEPROMs or flash memories, programming voltages are required for them which must have values in the range of 12V to 20V or may even be negative, depending on the memory concept. The known circuit configuration serves to switch a relatively high programming voltage. However, negative voltages cannot be switched by that known circuit configuration.

SUMMARY OF THE INVENTION

It is accordingly an object of the invention to provide a method for switching voltages higher than a supply voltage on a semiconductor chip with a circuit configuration, which overcomes the hereinafore-mentioned disadvantages of the heretofore-known methods of this general type and in which both positive and negative voltages can be switched and at the same time are free from parallel-path currents.

With the foregoing and other objects in view there is provided, in accordance with the invention, a method for switching voltages higher than a supply voltage on a semiconductor chip, with a circuit configuration, which comprises connecting a first series circuit including a first p-channel transistor and a first n-channel transistor between a terminal for a first high potential and a terminal for a first low potential; connecting a second series circuit including a second p-channel transistor and a second n-channel transistor between the terminal for the first high potential and a first input terminal; connecting a junction point of the two transistors of the first series circuit to a gate terminal of the second p-channel transistor; connecting a terminal for an output signal to the junction point of the two transistors of the first series circuit; connecting a junction point of the transistors of the second series circuit to a gate terminal of the first p-channel transistor; connecting a second input terminal to a gate terminal of the second n-channel transistor; connecting a third series circuit including a third p-channel transistor and a third n-channel transistor between a third input terminal and the terminal for the first low potential; connecting the junction point of the two transistors of the first series circuit to a gate terminal of the third n-channel transistor; connecting a junction point of the transistors of the third series circuit to a gate terminal of the first n-channel transistor; connecting a fourth input terminal to a gate terminal of the third p-channel transistor; selecting potentials at the input terminals to be equal to or lie between supply voltages for a semiconductor chip; and selecting the first high potential to be greater than a high supply voltage of the semiconductor chip or selecting the first low potential to be negative and suitable, in particular, for programming or erasing non-volatile memory cells.

In accordance with another feature of the invention, there is provided a method which comprises slowly increasing the first potentials to a final value after being switched on.

In accordance with a further feature of the invention, there is provided a method which comprises initially applying the second potentials when the circuit configuration is started up, and then switching on the first potentials.

In accordance with an added feature of the invention, there is provided a method which comprises slowly increasing the first potentials to a final value after being switched on.

In accordance with an additional feature of the invention, there is provided a method which comprises connecting the second and fourth input terminals to one another to form a terminal for a control signal; supplying a second low potential at least equal to the first low potential to the first input terminal; and supplying a second high potential less than the first high potential to the third input terminal.

In accordance with yet another feature of the invention, there is provided a method which comprises connecting the first and third input terminals to one another to form a terminal for a control signal; supplying a second high potential at most equal to the first high potential to the second input terminal; and supplying a second low potential at least equal to the first low potential to the fourth input terminal.

In accordance with yet a further feature of the invention, there is provided a method which comprises producing the first and third n-channel transistors in a p-type trough insulated from a p-type substrate, in the case of a technological realization of the transistors in a p-conducting substrate.

In accordance with a concomitant feature of the invention, there is provided a method which comprises producing the first and second p-channel transistor in an n-type trough insulated from an n-type substrate, in the case of a technological realization of the transistors in an n-conducting substrate.

The method for switching voltages according to the invention can be used in a simple manner, without any additionally outlay in terms of circuitry, for non-inverting switching or inverting switching. The functioning only depends on the voltages which are applied to the four input terminals and on the way in which the latter are interconnected. It is particularly advantageous if the voltage to be switched has a ramp profile during switch-on. In order to avoid a substrate bias voltage in the logic section of the semiconductor chip, it is advantageous to construct the p-channel transistors connected to the first high potential in the case of a n-type substrate, and the n-channel transistors connected to the first low potential in the case of a p-type substrate, in a trough of the same conduction type as the substrate. The trough is insulated from the substrate by a region of the other conduction type.

Other features which are considered as characteristic for the invention are set forth in the appended claims.

Although the invention is illustrated and described herein as embodied in a method for switching voltages higher than a supply voltage on a semiconductor chip with a circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
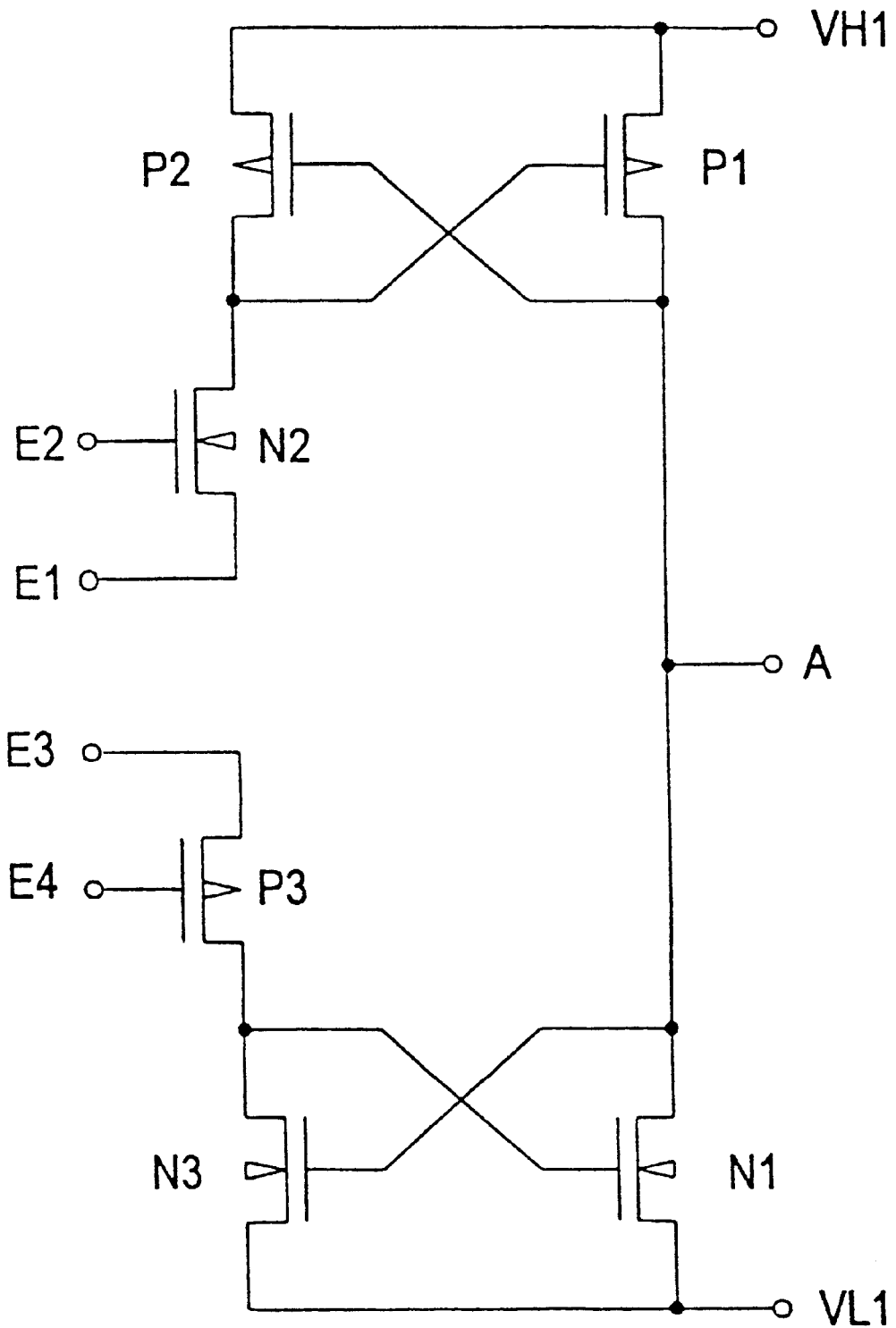
FIG. 1 is a general schematic diagram of a circuit configuration according to the invention with a tristate option.

Referring now to the figures of the drawings in detail and first, particularly, to FIG. 1 thereof, there is seen a circuit configuration according to the invention in which a series circuit including a first p-channel transistor P1 and a first n-channel transistor N1 is connected between a terminal for a first high potential VH1 and a terminal for a first low potential VL1. A junction point of the two transistors forms an output terminal A. A load path of a second p-channel transistor P2 is connected between the terminal for the first high potential VH1 and a gate terminal of the first p-channel transistor P1. A gate terminal of this second p-channel transistor P2 is connected to the output terminal A. The gate terminal of the first p-channel transistor P1 is additionally connected through a load path of a second n-channel transistor N2 to a first input terminal E1. A gate terminal of this second n-channel transistor N2 is connected to a second input terminal E2. A load path of a third n-channel transistor N3 is connected between a gate terminal of the first n-channel transistor N1 and the terminal for the first low potential VL1. A gate terminal of this third n-channel transistor N3 is likewise connected to the output terminal A, while the gate terminal of the first n-channel transistor N1 is connected through a load path of a third p-channel transistor P3 to a third input terminal E3. A gate terminal of the third p-channel transistor P3 is connected to a fourth input terminal E4. With this circuit configuration, it is possible to make a suitable selection of the potentials at the input terminals E1 to E4 in order to switch either the first high potential VH1 or the first low potential VL1 through to the output terminal A, or the output terminal A can be switched to high impedance. A particular advantage of this circuit configuration is that the first low potential VL1 can assume negative values.

In order to switch the first high potential VH1 through to the output terminal A, a higher potential must be applied to the second input terminal E2 than to the first input terminal E1. In this case, the potential at the first input terminal E1 must additionally be lower than the first high potential VH1. As a result, the second n-channel transistor N2 is switched on, whereby the first p-channel transistor P1 is also switched on. The output terminal A consequently assumes the value of the first high potential VH1 and thus also switches on the second p-channel transistor P2, whereby the first p-channel transistor P1 is locked in its on position. If at the same time the potential at the fourth input terminal E4 is greater than or equal to the potential at the third input terminal E3, the third p-channel transistor P3 switches off, while the third n-channel transistor N3 switches on due to the high potential at the output terminal A and therefore at its gate terminal and pulls the gate terminal of the first n-channel transistor N1 to the first low potential VL1. In this way the first n-channel transistor N1 reliably switches off and is locked in this position by the third n-channel transistor N3.

If the potential at the fourth input terminal E4 is selected to be less than the potential at the third input terminal E3 and the potential at the second input terminal E2 is selected to be less than the potential at the first input terminal E1, the first low potential VL1 is switched through to the output terminal A in an equivalent manner.

The circuit configuration according to the invention is operated in a particularly advantageous manner if the potential which is to be switched through to the output terminal A is not switched on until after the application of the potentials to the input terminals E1 to E4 and/or if the potential which is to be switched through to the output terminal A has a ramp profile, in other words it is not switched on suddenly but rather it is raised gradually to its final value. Particularly reliable operation is possible because of this provision.

Figure 2:
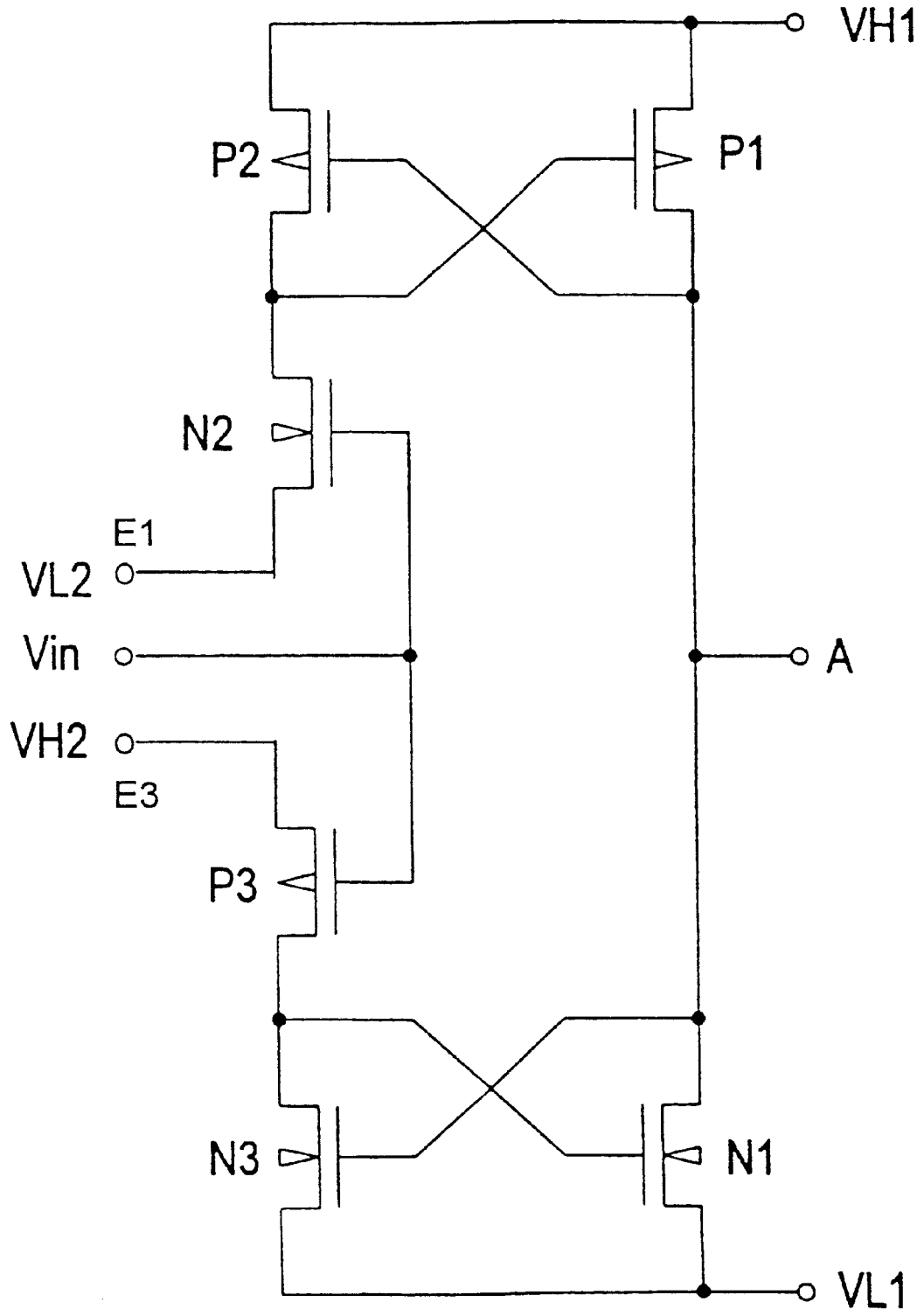
FIG. 2 is a circuit diagram of a non-inverting switch.

A special variant of the circuit configuration according to the invention as shown in FIG. 1 is illustrated in FIG. 2. In this case, the gates of the transistors N2 and P3 which are connected to the input terminals E2 and E4 in FIG. 1 are interconnected and have a control signal Vin applied to them. A second low potential VL2, which is greater than or equal to the first low potential VL1, is applied to the first input terminal E1, while a second high potential VH2, which is less than or equal to the first high potential VH1, is applied to the third input terminal E3. This variant represents a non-inverting switch with regard to the control signal Vin. This is because given a level of this control signal Vin which is equal to the second high potential VH2, the output terminal A assumes the value of the first high potential VH1, and vice versa.

Figure 3:
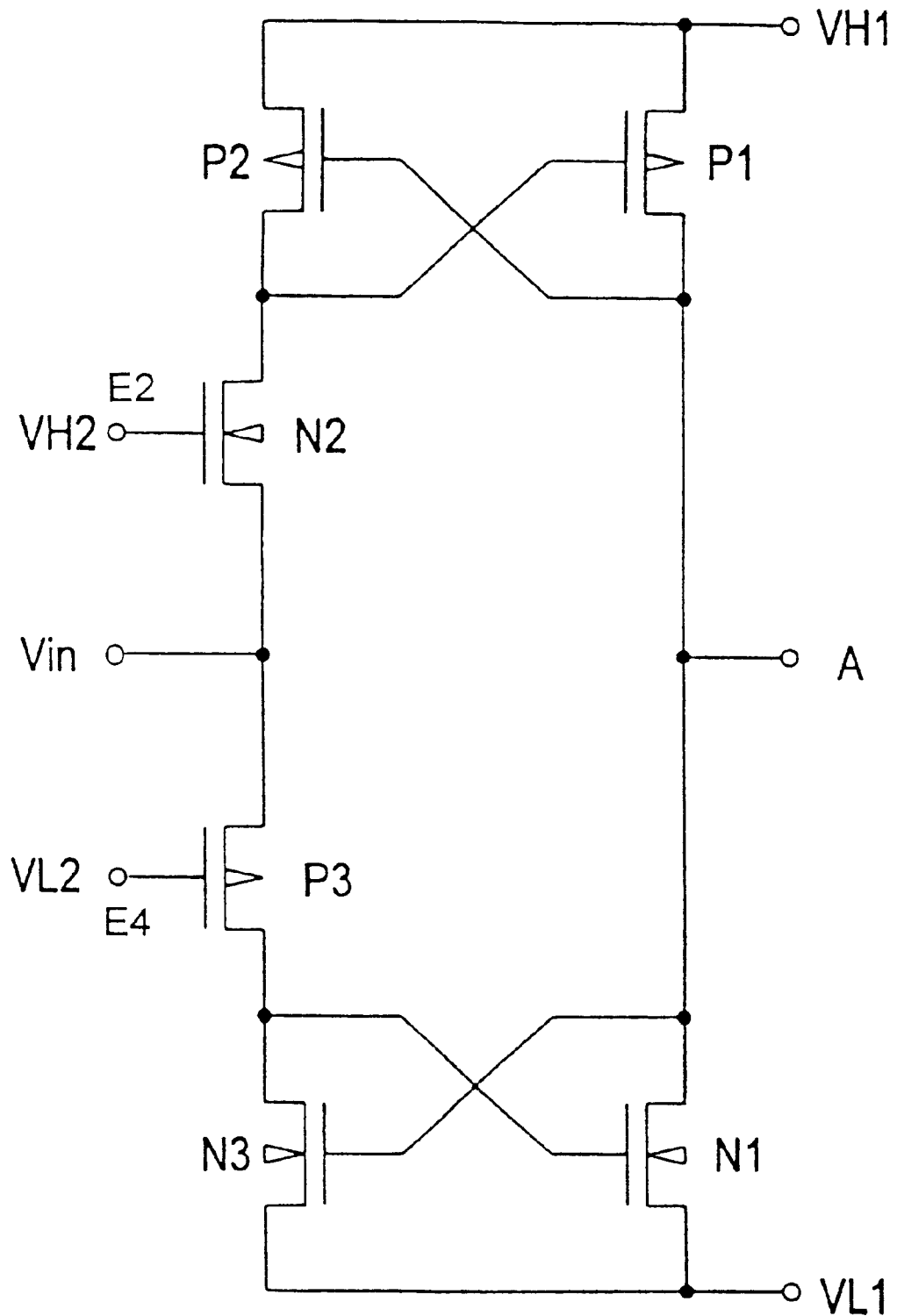
FIG. 3 is a circuit diagram of an inverting switch.

In contrast to the circuit of FIG. 2, FIG. 3 shows an inverting switch with regard to a control signal Vin. For this purpose, the load paths of the transistors N2 and P3 which are connected to the first and third input terminals E1 and E3 in FIG. 1 are interconnected in FIG. 3 and have the control signal Vin applied to them. A second high potential VH2 is applied to the second input terminal E2 and a second low potential VL2 is applied to the fourth input terminal E4. The same conditions apply for the values of the second potentials as for the circuit according to FIG. 2.

Although the circuit configurations which have been described can be used generally, they are suitable in a particularly advantageous manner for driving a word line in flash memories. In that case, the second high potential VH2 is the supply voltage of the chip and the second low potential VL2 is the reference potential. The first high potential VH1 is an erase voltage and the first low potential VL1 is a programming voltage. In addition, it must be possible to switch a second positive voltage as a read voltage onto the word line. This is done by selecting this read voltage instead of the erase voltage to be the first high potential. Depending on the variant of the circuit configuration according to the invention which has been selected, either as an inverting switch or a non-inverting switch, it is consequently possible, by suitable selection of the control signal Vin, in each case to switch the desired voltage onto the word line.

Figure 4:
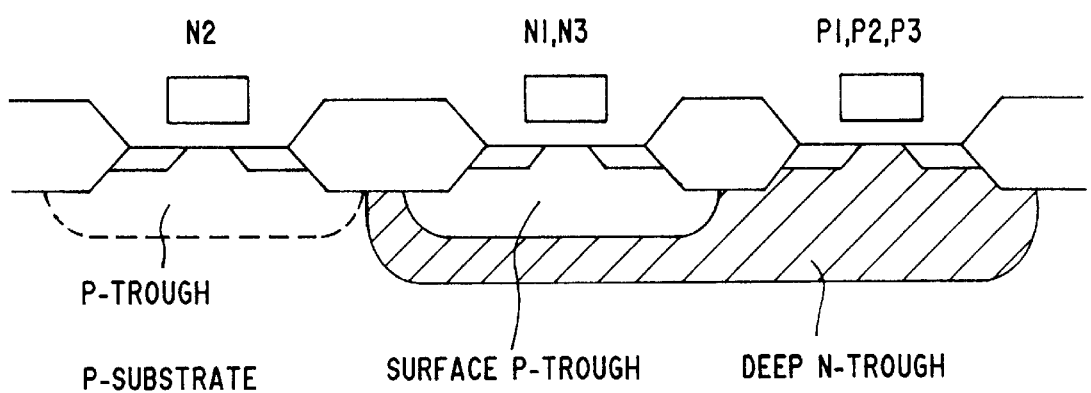
FIG. 4 is a fragmentary, diagrammatic, cross-sectional view illustrating options for a technological realization of the invention.

A technological realization of the circuit configurations is possible using standard CMOS. In the case of n-type and p-type trough technology, it is to be noted herein that the substrate potential must be at the lowest (most negative) and highest (most positive) voltage, respectively. When the first low potential is less than the second low potential and an n-type trough is provided and/or when the first high potential is greater than the second high potential and a p-type trough is provided, this means that the n-channel and/or p-channel transistors in the logic section of the semiconductor chip (which is supplied with the first and the second low potential) have a substrate bias voltage applied to them. This substrate bias voltage in the logic section can be avoided through the use of the so-called "triple well" technique. In the case of a p-type substrate, as is illustrated in FIG. 4, the first and the third n-channel transistors N1 and N3 are realized in an insulated p-type trough, with the result that the substrate potential for the logic transistors may be at the second low potential, that is to say normally at earth potential. In the case of an n-type substrate, the first and the second p-channel transistors would have to be correspondingly situated in an insulated n-type trough.

I claim:

1. A method for switching voltages on a semiconductor chip, with a circuit configuration provided thereon, which comprises:

connecting a first series circuit including a first p-channel transistor and a first n-channel transistor between a first switching terminal and a second switching terminal;

connecting a second series circuit including a second p-channel transistor and a second n-channel transistor between the first switching terminal and a first input terminal;

connecting a junction point of the two transistors of the first series circuit to a gate terminal of the second p-channel transistor;

connecting an output terminal for an output signal to the junction point of the two transistors of the first series circuit;

connecting a junction point of the transistors of the second series circuit to a gate terminal of the first p-channel transistor;

connecting a second input terminal to a gate terminal of the second n-channel transistor;

connecting a third series circuit including a third p-channel transistor and a third n-channel transistor between a third input terminal and the second switching terminal;

connecting the junction point of the two transistors of the first series circuit to a gate terminal of the third n-channel transistor;

connecting a junction point of the transistors of the third series circuit to a gate terminal of the first n-channel transistor;

connecting a fourth input terminal to a gate terminal of the third p-channel transistor;

providing a low supply voltage and a high supply voltage for the semiconductor chip, the high supply voltage being greater than the low supply voltage;

first applying potentials at the input terminals having an absolute value at most equal to one of the low supply voltage and the high supply voltage for the semiconductor chip; and subsequently, applying a first high potential at the first switching terminal greater than the high supply voltage of the semiconductor chip or selecting a first low potential at the second switching terminal to be negative and suitable for programming or erasing non-volatile memory cells.

2. The method according to claim 1, which comprises slowly increasing a potential at the output terminal to a final value after being switched on, the final value being one of the first high potential and the first low potential.

3. The method according to claim 1, which comprises:

connecting the second and fourth input terminals to one another to form a terminal for a control signal;

supplying a second low potential at least equal to the first low potential to the first input terminal; and supplying a second high potential less than the first high potential to the third input terminal.

4. The method according to claim 1, which comprises:

connecting the first and third input terminals to one another to form a terminal for a control signal;

supplying a second high potential at most equal to the first high potential to the second input terminal; and supplying a second low potential at least equal to the first low potential to the fourth input terminal.

5. The method according to claim 1, which comprises producing the first and third n-channel transistors in a p-type trough insulated from a p-type substrate.

6. The method according to claim 1, which comprises producing the first and second p-channel transistor in an n-type trough insulated from an n-type substrate.

7. A method for switching voltages on a semiconductor chip, with a circuit configuration provided thereon, which comprises:

connecting a first series circuit including a first p-channel transistor and a first n-channel transistor between a first switching terminal and a second switching terminal;

connecting a second series circuit including a second p-channel transistor and a second n-channel transistor between the first switching terminal and a first input terminal;

connecting a junction point of the two transistors of the first series circuit to a gate terminal of the second p-channel transistor;

connecting an output terminal for an output signal to the junction point of the two transistors of the first series circuit;

connecting a junction point of the transistors of the second series circuit to a gate terminal of the first p-channel transistor;

connecting a second input terminal to a gate terminal of the second n-channel transistor;

connecting a third series circuit including a third p-channel transistor and a third n-channel transistor between a third input terminal and the second switching terminal;

connecting the junction point of the two transistors of the first series circuit to a gate terminal of the third n-channel transistor;

connecting a junction point of the transistors of the third series circuit to a gate terminal of the first n-channel transistor;

connecting a fourth input terminal to a gate terminal of the third p-channel transistor;

providing a low supply voltage and a high supply voltage for the semiconductor chip, the high supply voltage being greater than the low supply voltage;

selecting potentials at the input terminals to be equal to or lie between the low supply voltage and the high supply voltage for the semiconductor chip;

selecting a first high potential at the first switching terminal to be greater than the high supply voltage of the semiconductor chip or selecting a first low potential at the second switching terminal to be negative and suitable for programming or erasing non-volatile memory cells;

connecting the second and fourth input terminals to one another to form a terminal for a control signal;

supplying a second low potential at least equal to the first low potential to the first input terminal; and supplying a second high potential less than the first high potential to the third input terminal.

8. A method for switching voltages on a semiconductor chip, with a circuit configuration provided thereon, which comprises:

connecting a first series circuit including a first p-channel transistor and a first n-channel transistor between a first switching terminal and a second switching terminal;

connecting a second series circuit including a second p-channel transistor and a second n-channel transistor between the first switching terminal and a first input terminal;

connecting a junction point of the two transistors of the first series circuit to a gate terminal of the second p-channel transistor;

connecting an output terminal for an output signal to the junction point of the two transistors of the first series circuit;

connecting a junction point of the transistors of the second series circuit to a gate terminal of the first p-channel transistor;

connecting a second input terminal to a gate terminal of the second n-channel transistor;

connecting a third series circuit including a third p-channel transistor and a third n-channel transistor between a third input terminal and the second switching terminal;

connecting the junction point of the two transistors of the first series circuit to a gate terminal of the third n-channel transistor;

connecting a junction point of the transistors of the third series circuit to a gate terminal of the first n-channel transistor;

connecting a fourth input terminal to a gate terminal of the third p-channel transistor;

providing a low supply voltage and a high supply voltage for the semiconductor chip, the high supply voltage being greater than the low supply voltage;

selecting potentials at the input terminals to be equal to or lie between the low supply voltage and the high supply voltage for the semiconductor chip;

selecting a first high potential at the first switching terminal to be greater than the high supply voltage of the semiconductor chip or selecting a first low potential at the second switching terminal to be negative and suitable for programming or erasing non-volatile memory cells;

connecting the first and third input terminals to one another to form a terminal for a control signal;

supplying a second high potential at most equal to the first high potential to the second input terminal; and supplying a second low potential at least equal to the first low potential to the fourth input terminal.

* * * * *